(12) United States Patent
Bedeschi et al.

(10) Patent No.: US 8,259,515 B2
(45) Date of Patent: Sep. 4, 2012

(54) CIRCUITRY FOR READING PHASE-CHANGE MEMORY CELLS HAVING A CLAMPING CIRCUIT

(75) Inventors: Ferdinando Bedeschi, Agrate Brianza (IT); Claudio Resta, Agrate Brianza (IT)

(73) Assignee: Ovonyx, Inc., Troy, MI (US)

( * ) Notice: Subject to any disclaimer, the term of this patent is extended or adjusted under 35 U.S.C. 154(b) by 22 days.

(21) Appl. No.: 12/491,352

(22) Filed: Jun. 25, 2009

(65) Prior Publication Data

US 2009/0285016 A1    Nov. 19, 2009

Related U.S. Application Data

(62) Division of application No. 11/093,879, filed on Mar. 30, 2005, now Pat. No. 7,570,524.

(51) Int. Cl.
*G11C 7/06* (2006.01)
(52) U.S. Cl. .............. 365/189.15; 365/189.07; 365/207; 365/189.06; 365/189.09; 365/148; 365/163
(58) Field of Classification Search ............. 365/189.15, 365/148, 163, 190, 208, 207, 225.7, 189.06, 365/189.07, 189.09
See application file for complete search history.

(56) References Cited

U.S. PATENT DOCUMENTS 6,944,041 B1 * 9/2005 Li et al. .......................... 365/113
7,570,524 B2 * 8/2009 Bedeschi et al. ......... 365/189.06

* cited by examiner

*Primary Examiner* — Andrew Q Tran
(74) *Attorney, Agent, or Firm* — Trop, Pruner & Hu, P.C.

(57) ABSTRACT

A read circuit for reading at least one memory cell adapted to storing a logic value, the at least one memory cell including: a storage element made of a phase-change material; and an access element for coupling the storage element to the read circuit in response to a selection of the memory cell, the read circuit including: a sense current supply arrangement for supplying a sense current to the at least one memory cell; and at least one sense amplifier for determining the logic value stored in the memory cell on the basis of a voltage developing thereacross, the at least one sense amplifier comprising a voltage limiting circuit for limiting the voltage across the memory cell for preserving the stored logic value, wherein the voltage limiting circuit includes a current sinker for sinking a clamping current, which is subtracted from the sense current and depends on the stored logic value.

6 Claims, 5 Drawing Sheets

US 8,259,515 B2

CIRCUITRY FOR READING PHASE-CHANGE MEMORY CELLS HAVING A CLAMPING CIRCUIT

CROSS-REFERENCE TO RELATED APPLICATIONS

This application is a divisional of U.S. patent application Ser. No. 11/093,879, filed on Mar. 30, 2005 now U.S. Pat. No. 7,570,524.

BACKGROUND

The present invention generally relates to the field of semiconductor memories, particularly to non-volatile memories and, even more particularly, to memories based on phase-change materials, also known in the art as ovonic unified memories.

Ovonic unified or phase-change memories are an emerging type of electrically-alterable non-volatile semiconductor memories. These memories exploit the properties of materials (phase-change materials) that can be reversibly switched between an amorphous phase and a crystalline phase when heated. A phase-change material exhibits different electrical characteristics, particularly a different resistivity, peculiar of each one of the two phases; thus, each material phase can be conventionally associated with a corresponding one of the two logic values, "1" and "0".

Typically, the memory includes a matrix of phase-change memory cells, arranged in rows and columns with associated word lines and bit lines, respectively. Each memory cell consists of a storage element connected in series to an access element; the series of the storage element and the access element is connected between the respective word line and the respective bit line.

The memory cells can be selected for a reading operation, for example, by applying suitable voltages to the respective word lines and suitable current or voltage pulse to the respective bit lines. During a reading operation, a read current pulse causes the charging of stray capacitances intrinsically associated with the bit lines, and, accordingly, a corresponding transient (the duration of which depends on the state of the storage element) of a bit line voltage at each selected bit line. The respective bit line voltage raises towards a corresponding steady-state value Vfinal, depending on the resistance of the storage element, i.e., on the logic value stored in the selected memory cell.

The logic value stored in the memory cell is evaluated by sense amplifiers of the memory. A sense amplifier may include a comparator input receiving the bit line voltage and another comparator input from a suitable reference voltage. The reference voltage which may be band-gap based for temperature and voltage compensation is generated, for example, by a voltage which may be either adjusted at probe or packaging or even in the field based on array bit testing or may be generated using a service reference memory cell. If using a reference cell charged by current during read, similarly to the bit line voltage, the reference voltage may undergo a transient during a reading operation.

In the case in which the bit line voltage is higher than the reference voltage, this situation, for example, is decreed to correspond to a stored logic value "0", whereas in the case in which the bit line voltage is smaller than the reference voltage, this situation is decreed to correspond to the stored logic value "1".

If the current flowing through the selected memory cell exceeds a threshold current value, typically of only few microamperes, a heating by a Joule effect of the storage element is caused, which, consequently, may be spuriously programmed. In order to avoid spurious programming of the storage elements, for example, the read current may be limited to a value lower than the oum threshold current.

Such a small current may involve a relatively slow charging of the bit line stray capacitances, which implies an increase of the time required for a reading operation. In particular, in the case the memory is adapted to perform reading operations in a burst way, an initial latency, i.e., a time range between a first time in which a first address is provided to the memory and a second time in which the first data read is output, is increased. The request for faster and faster reading operation consequently prefers smaller and smaller initial read access cycle times and access latency delay.

BRIEF DESCRIPTION OF THE DRAWINGS

These and other features, and the advantages of the present invention will be made apparent by the following detailed description of some embodiments thereof, provided merely by way of non-limitative examples, description that will be conducted making reference to the attached drawings, wherein.

DETAILED DESCRIPTION

Figure 1:
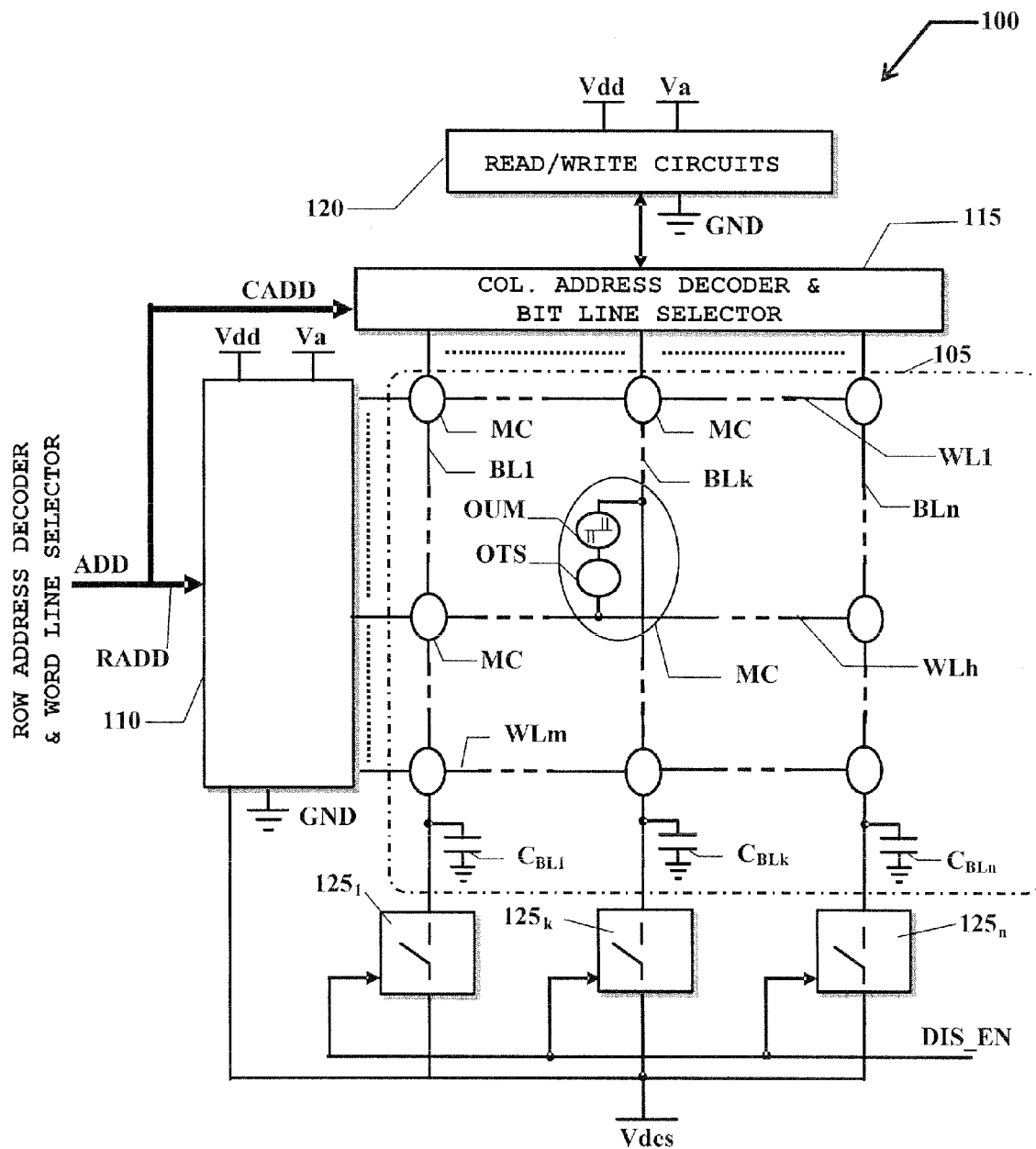
FIG. 1 schematically shows the relevant circuit blocks of a memory device in which the present invention is applicable.

With reference to the drawings, in FIG. 1 the functional blocks of a non-volatile semiconductor memory device 100 relevant to the understanding of the invention embodiments herein described are schematically shown. Specifically, the semiconductor memory device 100 is an ovonic unified electrically-alterable non-volatile memory device.

The memory device 100 includes a plurality of memory cells MC typically arranged in a matrix 105. The memory cells MC in the matrix 105 are arranged by m rows and n columns; a respective word line WL1-WLm is associated with each matrix row, and a respective bit line BL1-BLn is associated with each matrix column.

The memory device 100 may also include a number of auxiliary lines, useful for the operation thereof. In particular, the memory device 100 is provided with a supply voltage line Vdd, distributing a supply voltage Vdd through a chip including the memory device 100, that, depending on the specific memory device embodiment, may be, typically, from 1 to 3 V, for example 1.8 V; a ground voltage line GND distributes the ground voltage. A high voltage supply line Va provides a relatively high voltage, generated by devices (e.g. charge-pump voltage boosters not shown in the drawing) integrated on the same chip, or externally supplied to the memory device 100; for example, the high voltage Va is 4.5-5 V. Spare rows and columns may be provided for test and redundancy repair purposes.

As shown, each memory cell MC in the matrix 105 includes an ovonic unified memory element OUM, i.e., a storage element having a programmable resistivity; the storage element OUM is connected in series to an associated access element, in the shown example consisting of an ovonic threshold switch OTS. Alternative access devices may be used such as, for example, an MOS n or p-channel transistor, or an MOS or bipolar diode.

Each storage element OUM is made of a phase-change material, typically consisting of a chalcogenide (e.g., a $Ge_2Sb_2Te_5$ alloy, sometimes referred to as GST 225). The phase-change material can be reversibly switched between a generally amorphous, disordered phase and a generally crystalline, more ordered phase. The two phases of the material exhibit different electrical characteristics; particularly, when the material is in the amorphous phase, it exhibits a relatively high resistivity, whereas when the material is in the crystalline phase, it has a low resistivity. It is the material resistivity difference in the two phases that is exploited to store a binary value. If the storage element OUM is in the amorphous phase, characterized by a high resistivity, the memory cell MC is conventionally considered in a reset state, and this state is associated with a binary value, for example a "0". If the storage element OUM is in the crystalline phase, characterized by a low resistivity, the memory cell MC is conventionally considered in a set state, which is associated with the opposite binary value, in the example herein considered a "1".

The phase of the phase-change material (depending on alloy selected) is stable below a temperature (such as 150° C.). The material phase can be changed by heating the material over such a temperature. For this purpose, a voltage higher than a corresponding phase-change value $Vth_{oum}$ (for example, 1V) is applied to the storage element OUM; the applied voltage causes the flow of a current through a resistive element placed in contact to the phase-change material of the storage element OUM, which resistive element acts as a local Joule-effect heater, and accordingly raises the temperature of the phase-change material.

Depending on the current forced therethrough in a current force approach or the voltage applied thereacross (and thus on the current flowing therethrough), if the storage element OUM is heated over a "nucleation" temperature (typically greater than 200° C.) or heated to a higher temperature (such as 600 C), and then cooled down slowly, the phase-change material becomes crystalline. Conversely, if the storage element OUM is heated over a higher, melting temperature (such as 600° C.) and then cooled down rapidly, the phase-change material becomes amorphous. Such slow cooling may be achieved by having a slow trailing edge rate on the current pulse or decaying voltage on the column, such as slower than 500 nsec/volt. Use of such a slow trailing edge rate is necessary to crystallize only if the peak melting temperature is closer to that of a reset bit, such as 600 C. A fast cooling may be achieved by forcing a fast trailing edge, such as less than 5 nsec/volt when resetting a bit, such as through use of a quenching pulldown transistor 125 turned-on at the end of the write current pulse.

The state of the storage element OUM can be detected by sensing the current flowing therethrough in response to a voltage applied across the OUM or the resulting voltage when a current is forced, which magnitude of resulting voltage on or current in the column depends on the resistivity of the phase-change material and provides therefore an indication of the material phase or logic state. A voltage dropping across the storage element OUM may be suitably lower than the phase-change value $Vth_{oum}$, to avoid causing an undesired change of phase of the OUM memory material during repeated reads prior to rewriting or refreshing the OUM by another write cycle.

The access element OTS typically consists of a chalcogenide, but is exploited in one single phase, generally amorphous. Particularly, the access element OTS is a two-terminal device which switches from a high-resistance condition to a low-resistance condition when a current therethrough exceeds Ith (OTS), such as when the voltage applied thereacross exceeds a threshold value Vth (OTS) (such as at about 3 V), and reverts to the high-resistance condition when a current flowing therethrough falls below a minimum holding value Ih (ots), such as less than 0.5 microamp. The high resistance of the access element OTS, until it thresholds, may be greater than the high resistance (until it thresholds) of the storage element OUM storing a logic value "0". Also, the threshold current of the OTS may be engineered and processed to be less than the threshold current of the OUM, such as through adjusting the contact size of the OTS to be smaller than the OUM, or through adjusting the alloy and electrode compositions of the OTS and OUM.

The access element OTS has two distinct operation regions associated with the high and low resistance. Below the threshold voltage Vth (OTS) the access element OTS conducts a current less than Ith (OTS), whereas exceeding the threshold voltage $Vth_{OTS}$ of the access element, the OTS conducts a current greater than Ith (OTS) and remains triggered so long as the current through the device at least exceeds to the holding current Ih (OTS) at a substantially constant voltage Vh (OTS) (hereinafter referred to as holding voltage). The holding voltage $Vh_{OTS}$ can be lower than the threshold voltage Vth (OTS) (for example, about 2.5 V) and, when the access element OTS switches from the high-resistance condition to the low-resistance condition, a voltage across the access element OTS may snap back to this lower holding voltage. The above-described behavior of the access element OTS or OUM may be symmetrical, i.e. the access element OTS or OUM may be a bi-directional device and threshold to a lower resistance state when a voltage greater in magnitude than Vth is applied across the OTS or oum device in either direction.

Each memory cell MC in the matrix 105 is connected to a respective one of the word lines WL1-WLm and a respective one of the bit lines BL1-BLn. In particular, within each memory cell MC the storage element OUM has a first terminal connected to the respective bit line BL1-BLn and a second terminal connected to a first terminal of the associated access element OTS; the access element OTS has a second terminal connected to the respective word line WL1-WLm. Alternatively, the storage element OUM may be connected to the respective word line WL1-WLm and the access element OTS, associated with the storage element OUM, may be connected to the respective bit line BL1-BLn. That is, the order of connection of the components of the memory cell may be reversed within the cell, as well as the polarity of connection to the bit and word lines.

A generic memory cell MC within the matrix 105 is accessed by selecting the corresponding row and column pair, i.e. by selecting the corresponding word line and bit line pair. To this purpose, word line selector circuits 110 and bit line selector circuits 115 perform the selection of the word lines and of the bit lines on the basis of a row address binary code RADD and a column address binary code CADD, respectively, part of a memory address binary code ADD, for example received by the memory device 100 from a device external to the memory (e.g., a microprocessor).

The word line selector circuits 110 decode the row address code RADD and select a corresponding one of the word lines WL1-WLm, identified by the specific row address code RADD received. The bit line selector circuits 115 decode the column address code CADD and select a corresponding bit line or, more generally, a corresponding bit line packet of the bit lines BL1-BLn (for example, the number of selected bit lines depending on the number of data words that can be read during a burst reading operation on the memory device 100), each bit line BL1-BLn being identified by the specific column address code CADD received.

The bit line selector circuits 115 interface with read/write circuits schematized as a block 120. The read/write circuits 120 include all the components which are normally required for writing the desired logic values into the selected memory cells MC, and for reading the logic values currently stored therein. For example, the read/write circuits 120 include, e.g., 128 sense amplifiers together with comparators, reference current/voltage generators and current pulse generators helpful for reading the logic values stored in the memory cells MC.

In a stand-by operating condition, as well as before any read or write access to the memory device 100, the word line selection circuits 110 keep all the word lines WL1-WLm at a relatively high de-selection voltage Vdes, such as a voltage roughly equal to half the high voltage Va (Va/2). At the same time, the bit line selection circuits 115 keep all the bit lines BL1-BLn disconnected (floating), and thus isolated, from the read/write circuits 120 or, alternatively, at the de-selection voltage Vdes. In this way, none of the memory cells MC is accessed, since the bit lines BL1-BLn are floating or a voltage approximately equal to zero drops across the access elements OTS. Alternately, for better deselect margin, the V/3 approach may be used where the columns are deselected to Va/3 and the rows to 2Va/3.

During a reading or a writing operation, the word line selection circuits 110 lower the voltage of a selected one of the word lines WL1-WLm to a word line selection voltage $V_{WL}$ (having, for example, a value near to 0V—the ground), while the remaining word lines are kept at the word line de-selection voltage Vdes; similarly, the bit line selection circuits 115 couple a selected one of the bit lines BL1-BLn (more typically, a selected bit line packet) to the read/write circuits 120, while the remaining, non-selected bit lines are left floating or kept to the de-selection voltage Vdes. Typically, when the memory device 100 is accessed, the read/write circuits 120 force a suitable current pulse into each selected bit line BL1-BLn, the pulse amplitude depending on the reading or writing operations to be performed.

In particular, during a reading operation a read current pulse relatively higher than Ith(OTS) that may also be greater than Ith(OUM), is applied to each selected bit line, such as 50 ua. The read current pulse has a suitable amplitude Ir and a suitable time duration Tr (as described in greater detail in the following). The read current Ir causes the charging of stray capacitances $C_{BL1}$-$C_{BLn}$ (typically, of about 1 pF), intrinsically associated with the bit lines BL1-BLn, and, accordingly, a corresponding transient change of a bit line voltage $V_{BL}$ at each selected bit line BL1-BLn.

When the read current Ir is forced into each selected bit line BL1-BLn, the respective bit line voltage ($V_{BL}$ in FIG. 2) raises towards a corresponding steady-state value Vfinal, depending on the resistance of the storage element OUM, i.e., on the logic state stored in the selected memory cell MC. The duration and amplitude of the transient depends on the state of the storage element OUM: if the storage element OUM is in the crystalline state and the access element OTS is switched on, a cell current (Icell in FIG. 2) flowing through the selected memory cell MC has a greater amplitude in less time (for having lower resistance) than in the case wherein the storage element OUM is more in the amorphous state, particularly for the same voltage applied across the OUM unless Vthoum is exceeded. Alternatively, in response to a read current forced into the selected column, the resulting voltage is less for a set or crystalline state than for a bit in the reset or amorphous state (unless the read current exceeds Ithoum).

The logic value stored in the memory cell MC is evaluated by means of a comparison of the bit line voltage (or another voltage related to the bit line voltage or current) with a suitable reference voltage, for example, obtained by exploiting a service reference memory cell or a voltage selected after testing the array. The reference voltage can be chosen to be an intermediate value between the bit line voltage when a logic value "0" is stored and the bit line voltage when a logic value "1" is stored, and the reference may be adjusted for measured or expected changes with power supply or temperature using techniques familiar to those reasonably skilled in the art.

In order to avoid spurious reading of the memory cells MC, the bit line stray capacitances $C_{BL1}$-$C_{BLn}$ may be discharged before performing a read operation. To this purpose, bit line discharge circuits $125_1$-$125_n$ are provided, associated with each bit line BL1-BLn; the bit line discharge circuits $125_1$-$125_n$ are enabled in a bit line discharge phase of the memory device operation such as to Vdes, preceding any operation, for discharging the bit line stray capacitances $C_{BL1}$-$C_{BLn}$ to a safe voltage that avoids disturbing a cell.

The generic bit line discharge circuit $125_1$-$125_n$ can be implemented by means of a transistor, particularly an N-channel MOSFET having a drain terminal connected to the corresponding bit line BL1-BLn, a source terminal connected to a de-selection voltage supply line Vdes providing the de-selection voltage Vdes and a gate terminal controlled by a discharge enable signal DIS_EN. Before starting a writing or a reading operation, the discharge enable signal DIS_EN is temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ for reaching the de-selection voltage Vdes. Then, before selecting the desired word line WL1-WLm, the discharge enable signal DIS_EN is de-asserted and the discharge MOSFETs turned off. Similarly, a selected bit line may then be precharged to a safe voltage near but below where the select device turn-on may occur for decreased read delay. Alternately, the bit lines may be deselected and actively maintained at an appropriate deselect voltage such as Vdes.

Figure 2:
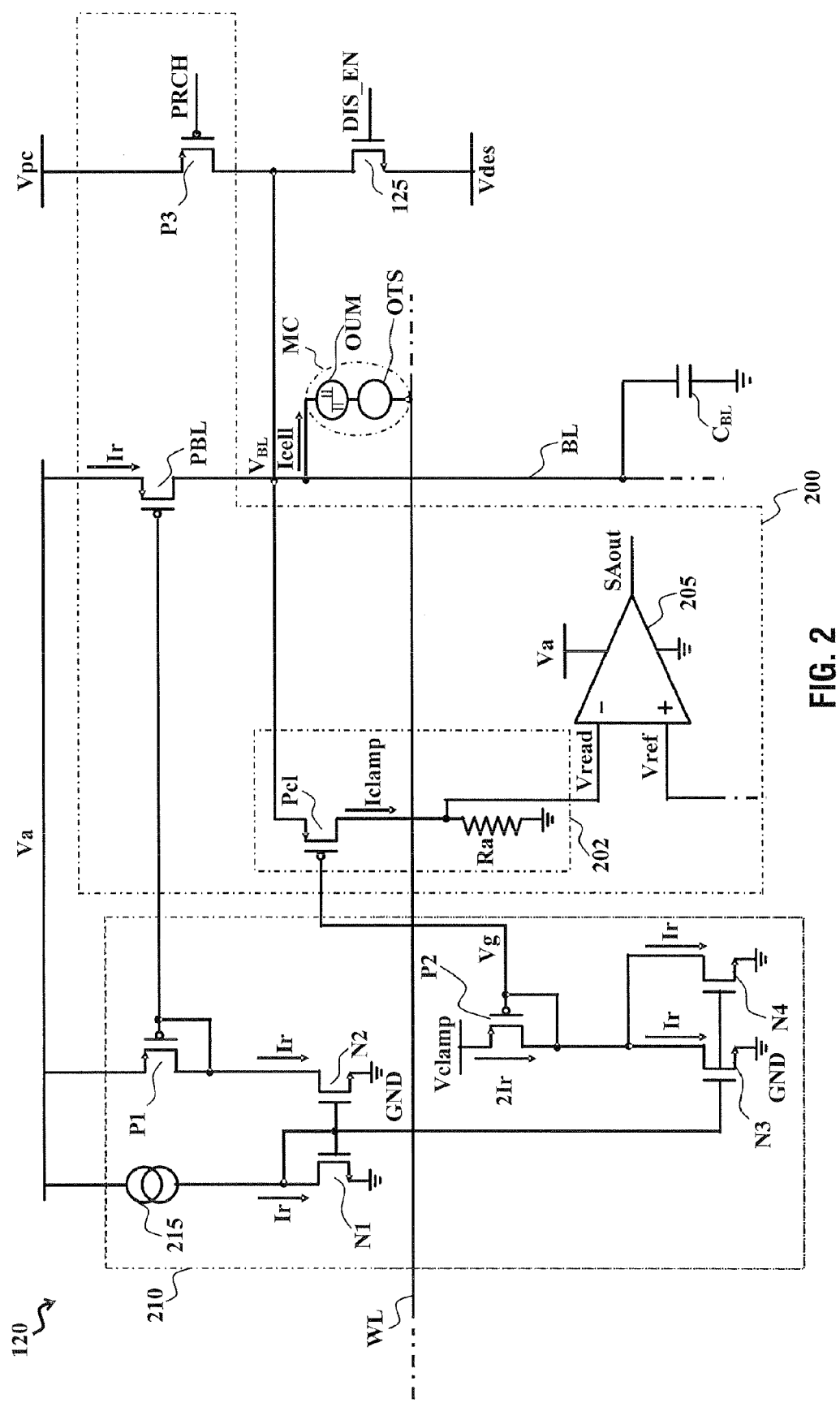
FIG. 2 illustrates a portion of read/write circuits of the memory device of FIG. 1, according to an embodiment of the present invention, in particular including a sense amplifier having a clamping circuit.

Considering now FIG. 2, a portion of the read/write circuits 120 according to an embodiment of the present invention is shown, in particular a generic one of a plurality of sense amplifiers 200 connected to a voltage generator 210 and including a clamping circuit 202 connected to a differential amplifier 205. In detail, the read/write circuits 120, shown schematically in FIG. 1, comprise, for example, 128 sense amplifiers 200 (only one shown in the drawing for simplicity of illustration or for operation at lower bandwidth), preferably and advantageously, the 128 sense amplifiers 200 being connected to one common voltage generator, such as shown in 210. Alternatively, more than one voltage generator 210 may be provided or groups of sense amplifier 200 are connected to a common voltage generator 210. Current sources, such as PBL but of greater magnitude (and duration for a write set operation), may be used to write the bit.

A selected memory cell MC of the memory device is controlled by a respective word line WL and a respective bit line BL. Associated with the bit line BL is a respective stray capacitance $C_{BL}$.

The clamping circuit 202 comprises a P-channel MOSFET Pcl, having a source terminal connected to the bit line BL; and a resistor Ra, having a first terminal connected to a drain terminal of the MOSFET Pcl; the resistor Ra has a second terminal connected to the ground voltage line GND. The MOSFET Pcl has a gate terminal connected to an output terminal of the voltage generator 210, providing a gate voltage Vg suitable for the operation of the clamping circuit 202.

The voltage generator 210 includes a current generator 215, supplying the read current Ir; the current generator 215 has a first terminal connected to the high voltage supply line Va, supplying the high voltage Va. The voltage generator 210 further includes two N-channel MOSFETs N1 and N2 connected in current-mirror configuration, i.e., respective gate terminals of the MOSFETs N1 and N2 are connected together and a drain terminal of the MOSFET N1 is connected to the gate terminal thereof; both the MOSFETs N1 and N2 have respective source terminals connected to the ground voltage line GND. The drain terminal of the MOSFET N1 is further connected to a second terminal of the current generator 215 in such a way that the MOSFET N1 sinks the read current Ir. The voltage generator 210 comprises also a P-channel MOSFET P1 having a drain terminal connected to a drain terminal of the MOSFET N2; the MOSFET P1 has the drain terminal further connected to a gate terminal thereof and a source terminal connected to the high voltage supply line Va. P1, PBL, Pcl and N1-4 may have on-off transistors in the source to assure consistent mirror current or as standby power reduction.

The voltage generator 210 includes two further N-channel MOSFETs N3 and N4 and a further P-channel MOSFET P2. The MOSFETs N3 and N4 are connected in parallel to each other, having respective gate terminals connected together to the gate terminals of the MOSFETs N1 and N2, respective drain terminals connected together to a drain terminal of the MOSFET P2 and respective source terminals connected to the ground voltage line GND. The MOSFETs N3 and N4 are thus in a current-mirror configuration with the MOSFET N1. The MOSFET P2 has a source terminal connected to a clamp voltage line Vclamp, supplying a clamp voltage Vclamp greater than $V_{WL}$+Vh (OTS)+Vth (OUM)/2 (e.g., typically, of about 3.25 V) generated by a further voltage generator; a gate terminal of the MOSFET P2 is connected to the drain terminal thereof and is exploited as the output terminal of the voltage generator 210 providing the gate voltage Vg. Additional read voltage margin may be provided through use of OTS with Vh (OTS) closer to Vth (OTS), so that the Vsnapback (Vth (OTS)−Vh (OTS)+Iread×dV/dI (OTS) is less than 0.25V.

The sense amplifier 200 further includes a P-channel MOSFET PBL having a drain terminal connected to the selected bit line BL and a source terminal connected to the high voltage supply line Va; a gate terminal of the MOSFET PBL is connected to the gate and drain terminals of the MOSFET P1 of the voltage generator 210 in current-mirror configuration.

The differential amplifier 205 has an inverting terminal "−" connected to the first terminal of the resistor Ra and a non-inverting terminal "+" receiving the reference voltage Vref, useful for the reading of the logic value stored in the memory cell MC. An output terminal of the differential amplifier 205 provides the logic value SAout read from the memory cell MC.

The sense amplifier 200 further comprises a P-channel MOSFET P3 having a drain terminal connected to the bit line BL and, then, to the drain terminal of one N-channel MOSFET 125 of the bit line discharge circuits. Gate terminals of the MOSFETs P3 and 125 receive a pre-charge voltage signal PRCH and the discharge enable signal DIS_EN, respectively. A source terminal of the MOSFET P3 is connected to a pre-charge voltage line Vpc, providing a suitable pre-charge voltage Vpc; the source terminal of the MOSFET 125 is connected to the de-selection voltage supply line Vdes, providing the de-selection voltage Vdes.

When the bit line DL has to be kept de-selected, the discharge enable signal DIS_EN is asserted, so that the MOSFET 125 is kept switched on, bringing the bit line BL to the de-selection voltage Vdes. At the beginning of a reading operation the discharge enable signal DIS_EN is de-asserted and optionally the pre-charge voltage signal PRCH asserted so that the capacitance $C_{BL}$ associated with the selected bit line BL is rapidly pre-charged from the de-selection voltage Vdes to the pre-charge voltage Vpc, although this charging may alternatively be done by the read current with more read access delay.

The pre-charge voltage Vpc has a value suitably close to but less than a bit line voltage value $V_{tOTS}^{BL}$ required for switching on the access element OTS of the memory cell MC, i.e.

$$V_{tOTS}^{BL} = Vth_{OTS} + V_{WL}. \tag{1}$$

Particularly, the pre-charge voltage Vpc is roughly equal to the bit line voltage value $V_{tOTS}^{BL}$ minus a voltage margin of few hundreds of millivolts.

During the reading operation, the current generator 215 forces the read current Ir into the MOSFET N1, which mirrors the read current Ir into the MOSFETs N2, N3 and N4. In this way the MOSFET P1 sinks the read current Ir and the MOSFET P2, connected in series to the MOSFETs N3 and N4, sinks a current 2Ir equal to a suitable multiple of the read current Ir, e.g. twice the read current Ir.

Accordingly, the gate terminal of the MOSFET P2 reaches the gate voltage Vg, which depends on the clamp voltage Vclamp and on the read current Ir, being $$2Ir = k \cdot (Vclamp - Vg - Vt)^2, \tag{2}$$

where k[A/V²] is a parameter depending on the MOSFET conductivity and Vt a MOSFET threshold voltage of the MOSFET P2, then $$Vg = Vclamp - Vt - \sqrt{\frac{2Ir}{k}}. \tag{3}$$

The MOSFET P1 mirrors the read current Ir into the MOSFET PBL and, then, the read current Ir is forced into the bit line BL.

Figure 3:
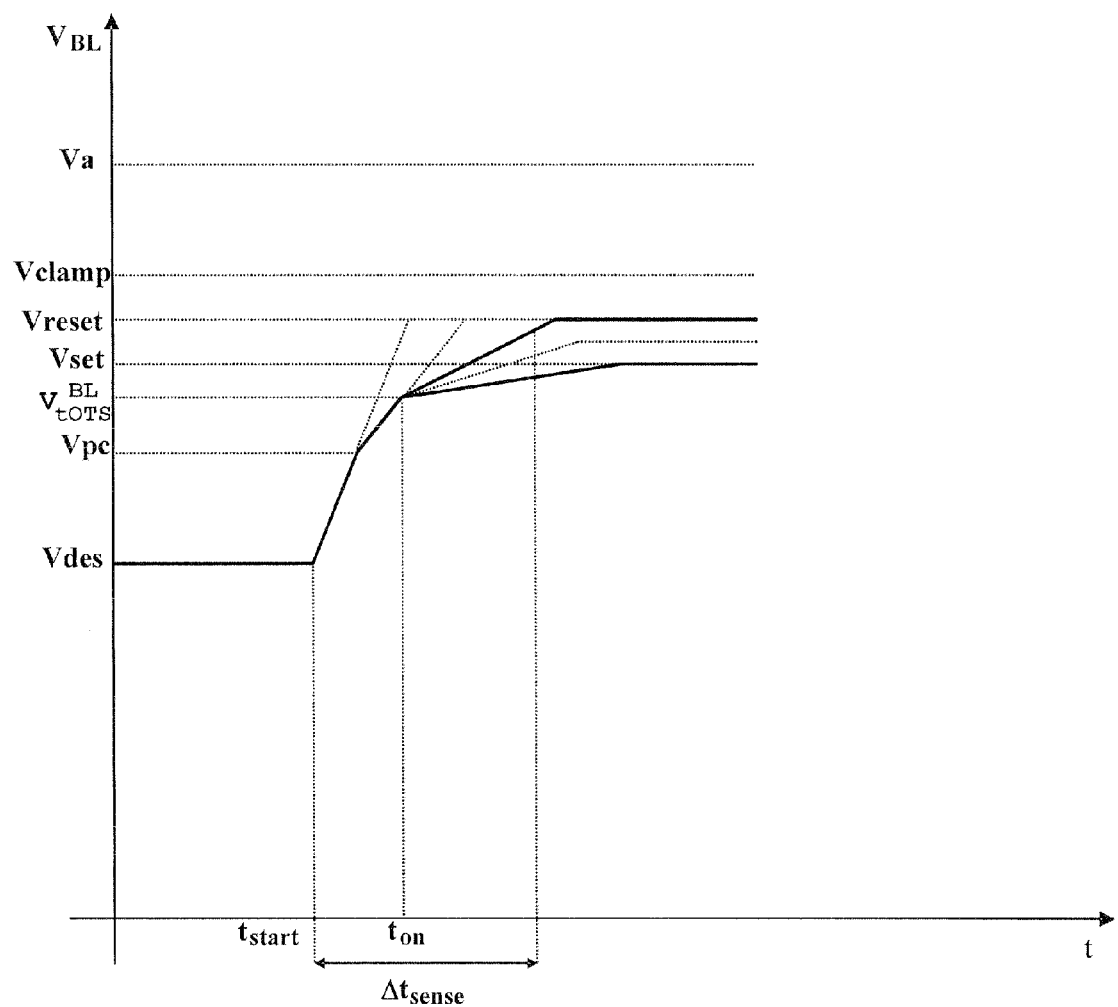
FIG. 3 represents a diagram of a voltage, reached at a bit line of the memory device of FIG. 1, vs. time during a reading operation on the memory device performed by the read/write circuits of FIG. 2.

As shown in FIG. 3, at a start time $t_{start}$, the bit line voltage $V_{BL}$ starts increasing from the de-selection voltage Vdes to the pre-charge voltage Vpc. Successively, the capacitance $C_{BL}$ is charged from Vdes (or from Vpc as shown, if pre-charged) by means of the read current Ir, the bit line voltage $V_{BL}$ increasing towards the value $V_{tOTS}^{BL}$ at ton. In this way, the access element OTS of the memory cell MC switches on at a time $t_{ON}$ when the bit line voltage $V_{BL}$ reaches the value $V_{tOTS}^{BL}$.

In detail, as long as the voltage $V_{BL} - V_{WL}$ is lower than the threshold voltage $Vth_{OTS}$ of the access element OTS, most of the voltage $V_{BL} - V_{WL}$ drops across the access element OTS, since the impedance of the access element OTS is greater than the impedance of the storage element OUM irrespective of the logic value stored in the memory cell MC. When the bit line voltage $V_{BL}$ reaches the value $V_{tOTS}^{BL}$, the voltage across the access element OTS is sufficient to switch the access element OTS on, which, then, has a relatively low resistance so long as the current through the ots exceeds Ihots. Consequently, when the access element OTS switches on, the voltage thereacross snaps back to the hold voltage $Vh_{OTS}$ and the voltage $V_{BL} - V_{WL} - Vh_{OTS}$ thereafter drops across the storage element OUM, except for a relatively small drop across the dynamic resistance of the ots after it is thresholded, a drop that is relatively small since the read current and dynamic resistance are both relatively small.

When the access element OTS switches on, the memory cell MC starts sinking a cell current Icell whose value depends on the stored logic value, and the bit line voltage $V_{BL}$ may decrease (such as If the bit is set) or increase still further, but with a lower gradient, if the bit is reset.

In particular, let a first case be considered in which the memory cell MC stores the logic value "1", the storage element OUM having a comparatively low resistance Rbit, and sinks the cell current Icell equal to the read current Ir. In this situation the MOSFET Pcl may remain switched off or be turned on only slightly, and the bit line voltage $V_{BL}$, thus, reaches a minimum steady value, a function of the resistance of the storage element OUM such that $$V_{BL}^{min} = Vh_{OTS} + Rbit \cdot Ir + V_{WL}. \quad (4)$$

If the MOSFET Pcl is kept switched off, this means that the minimum steady value of the bit line voltage $V_{BL}$ satisfies the condition $$V_{BL}^{min} - Vg < Vt, \quad (5)$$

the MOSFET Pcl having roughly the same MOSFET parameter k and threshold voltage Vt of the MOSFET P2, so that, exploiting equation (3), $$V_{BL}^{min} < Vclamp - \sqrt{\frac{2Ir}{k}} << Vclamp. \quad (6)$$

In the cases in which the MOSFET Pcl switches on, i.e. considering that the storage element OUM has a greater resistance Rbit, a clamp current Iclamp is sunk by the MOSFET Pcl, and consequently flows through the resistor Ra, satisfying the following equation:

$$Iclamp = k \cdot (V_{BL} - Vg - Vt)^2, \quad V_{BL} - Vg > Vt, \quad (7)$$

Accordingly, $$V_{BL} = Vg + Vt + \sqrt{\frac{Iclamp}{k}}. \quad (8)$$

Thus, at a steady state the bit line voltage $V_{BL}$, being Iclamp=Ir−Icell, satisfies the condition:

$$V_{BL} = Vg + Vt + \sqrt{\frac{Ir - Icell}{k}}. \quad (9)$$

In this way, the bit line voltage $V_{BL}$ is clamped to a value that depends on the voltage drop between the source and gate terminals of the MOSFET Pcl, which in turn depends on the logic value stored in the memory cell MC.

Considering a second case in which the memory cell MC stores the logic value "0", the storage element OUM exhibits a high resistance Rbit, ideally so high that the clamp current Iclamp sunk by the MOSFET Pcl is equal to the read current Ir; the bit line voltage $V_{BL}$ reaches a maximum steady value $$V_{BL}^{max} = Vg + Vt + \sqrt{\frac{Ir}{k}}. \quad (10)$$

Thus, exploiting equation (3), $$V_{BL}^{max} = Vclamp + \sqrt{\frac{Ir}{k}} - \sqrt{\frac{2Ir}{k}} = \quad (11)$$

$$= Vclamp - \sqrt{\frac{Ir}{k}} \cdot (\sqrt{2} - 1) < Vclamp.$$

As shown in FIG. 3, the bit line voltage reaches a different steady value depending on the stored logic value, and in any case lower than the suitable clamp voltage Vclamp. The value of the clamp voltage Vclamp is such that a voltage drop across the storage element OUM is below the phase-change voltage $Vth_{OUM}$ and preferably less than Vthoum/2 to avoid spurious programming of the storage element OUM, i.e.

$$Vclamp < Vwl + Vhots(\min) + Vthoum(\min). \quad (12),$$

where the min is the minimum value Vthoum for an array block in which Vclamp may be adjusted. Through use of higher write reset current, the Vthoum may if necessary be increased to be greater. This Reset current adjustment to improve read margin may be done either by adjusting at the manufacturer or in the field, such as by the user or memory chip sensing ECC errors and increasing the reset current if needed.

During a reading operation, depending on the logic value stored in the memory cell MC, i.e., on the resistance Rhit of the storage element OUM, the bit line voltage $V_{BL}$ reaches a steady "set-condition" value Vset in the case the memory cell MC stores a "1" (selected storage element OUM in the set state) and a steady "reset-condition" value Vreset in the case the memory cell MC stores a "0" (storage element OUM in the reset state), with Vreset higher than Vset, as described above.

The clamp current Iclamp flowing through the MOSFET Pcl is related to the bit line voltage $V_{BL}$ by equation (7), consequently also a read voltage Vread in FIG. 2 across the resistor Ra is related to the bit line voltage $V_{BL}$, being $$Vread = Ra \cdot Iclamp. \quad (13)$$

The resistor Ra acts as a simple current/voltage converter, for providing a read voltage Vread to the inverting terminal "−" of the differential amplifier 205; when the steady value Vreset or Vset of the bit line voltage $V_{BL}$ is reached, the read voltage Vread depends on the logic value stored in the memory cell MC.

The steady value Vreset or Vset is reached by the bit line voltage $V_{BL}$ in a time depending on the logic value stored in the memory cell MC starting from the time $t_{start}$. In particular, a transient of the bit line voltage $V_{BL}$ in the case of the stored logic value "1" may be faster than a transient of the bit line voltage $V_{BL}$ in the case of the stored logic value "0" for having a lower RC until the reset bit line reaches Vcl. Thereafter reaching about Vcl, the RC is less and the steady rate is reached quickly since the dynamic RC (before Pcl turns on) is Rcell×Cbl and faster thereafter, since the dynamic R of transistor Pcl after turn-on is then in parallel with Rcell.

The differential amplifier 205 dynamically compares the read voltage Vread to the reference voltage Vref and the read logic value SAout at the output terminal thereof is sampled when the bit line voltage $V_{BL}$ has reached the steady value, or is sufficiently close thereto. For this reason as shown in FIG. 3, the read logic value SAout is sampled after a suitable range of time Δtsense from the time $t_{start}$. Δtsense may also be determined by sensing the change in edge rate on the column after the OTS element thresholds, such as with a differentiator.

Aside from leakage diverting read current to unselected rows, Iclamp=Ir−Icell(selected). The reference voltage Vref is chosen greater than the read voltage Vread developing when the logic value "1" is stored, and lower than the read voltage Vread developing when the logic value "0" is stored. Accordingly, the sampled logic value SAout at the output terminal of the differential amplifier 205 corresponds to the logic value stored in the memory cell MC.

Other alternatives are possible as will be apparent to those reasonably skilled in the art. For example and not meant to be inclusive, the contrary is possible for reversing inputs to the amplifier 205, both for this example as well as the circuit of FIG. 2 discussed above, if the output of the differential amplifier is inverted by a logic inverter. When Vbl exceeds VREF, such as when a reset bit is sensed, the data may be latched and the read current source may be turned off to reduce power and stop further rise in the column voltage. Further, DIS-EN may then be asserted. If after a reasonable time, VREF is not exceeded, the bit may be determined to be and data latched as a set "1" bit. And, the cycle may also be similarly stopped, as if the Ir had been diverted to Pcl and Vref exceeded.

With read/write circuits according to the present invention, the read current can be made a larger than the OUM threshold current as desired for better speed (within the technological limits of the set resistance and avoiding current through the set bit that exceeds Isafe, a current that will start to convert the phase to reset after repeated reads). For example, in some applications, the read current may be greater than 50 μA for an OUM process whereby the bits reset at 200 ua or greater, for speeding up the charging of the stray bit line capacitance (for example, of 1 pF). The risk of spurious programming the select bit being read is avoided by limiting the voltage across the oum to less than Vth. Considering an exemplary case in which the clamp voltage is of about 3.25V and the resistance of the elements OUM in the crystalline phase is of about 1 kΩ and in the amorphous phase is of about 150 kΩ, the logic value sensed into the selected memory cell can be sampled after 25-30 ns, i.e., after a relatively short, not critical, time.

The voltage across a set bit may be as low as 0.05 V if the set bit is 1K ohm and the read current is 50 ua, with Vread near 0 since no current is diverted to Pcl. Similarly, voltage across a set bit may be as high as 0.5V if the set bit is 10K ohm and the read current remains at 50 ua. For a Vh of 2.5V, the bit line will then be about 3V, and near to turning on the Pcl clamp.

In contrast, the voltage across a reset bit is limited to not much more than 0.75V by diverting current to Pcl. If not more than 0.75V is allowed across the reset OUM, most of the 50 ua is diverted to Ra. At 0.75 across a 150K reset OUM resistor, less than 5 ua flows in the oum, and the balance of the read current (45 ua of 50 ua) through PCL in the steady state. If Ra is 20K ohms, Vread may be as high as 1 V if all the read current is diverted to Iclamp, so that Vref may be 0.4V for sensing between a 1 and 0.

Furthermore, improvements may be obtained in some embodiments by exploiting the example circuit elements of FIG. 2 for the clamping circuits. Alternatively, the resistor Ra or Ra' may be replaced by a capacitor which is precharged to initially have zero volts across it and timed for strobing a latch with an input from SAout.

Figure 4:
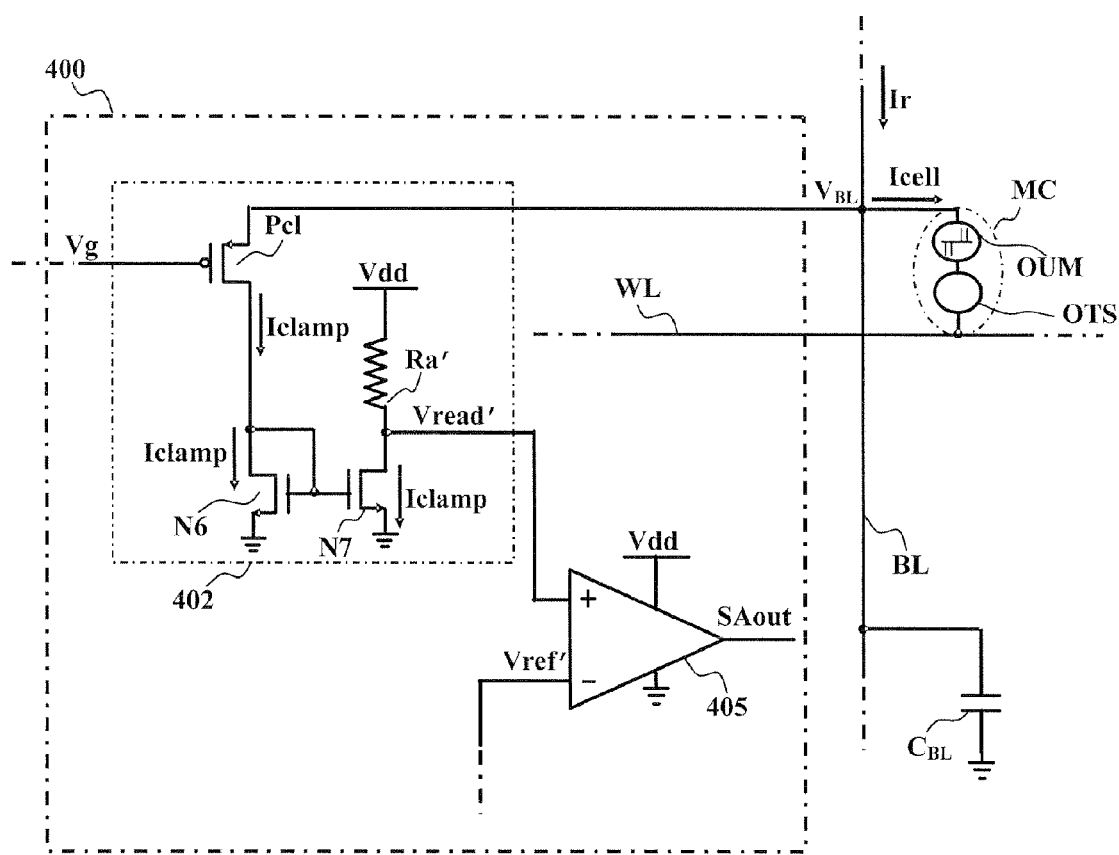
FIG. 4 illustrates a portion of a sense amplifier of the read/write circuits according to a further embodiment of the present invention.

Referring to FIG. 4, a portion of a generic sense amplifier 400 is shown, the sense amplifier 400 being included in the read/write circuits according to a further embodiment of the present invention. Compared to the clamping circuit 202 of the sense amplifier 200 described with reference to FIG. 2, a clamping circuit 402 of the sense amplifier 400 includes, in addition to a resistor Ra', two N-channel MOSFETs N6, N7 connected together in current-mirror configuration.

In detail, the MOSFET N6 has a drain terminal connected together with a gate terminal to the drain terminal of the MOSFET Pcl; the MOSFET N6 has a source terminal connected to the ground voltage line GND. The MOSFET N7 has a gate terminal connected to the gate and drain terminals of the MOSFET N6 and a source terminal connected to the ground voltage line GND. The resistor Ra' has a first terminal connected to a drain terminal of the MOSFET N7 and a second terminal connected to the supply voltage line Vdd, distributing the supply voltage Vdd.

The sense amplifier 400 includes a differential amplifier 405 having a non-inverting terminal "+" connected to the first terminal of the resistor Ra' and an inverting terminal "−" receiving a suitable reference voltage Vref', useful for the reading of the logic value stored in the memory cell MC. An output terminal of the differential amplifier 205 provides the logic value SAout read from the memory cell MC.

Here, the resistor Ra' may be connected to the supply voltage line Vdd, the differential amplifier 405 can be powered by the supply voltage Vdd, distributed by the supply voltage line Vdd, lower than the high voltage Va. In this way, it is possible to further reduce the power consumption of the sense amplifier 400.

During a reading operation, the MOSFET Pcl sinks the clamp current Iclamp, consequently flowing also through the MOSFET N6. The clamp current Iclamp is mirrored into the MOSFET N7 and flows through the resistor Ra'.

A read voltage Vread, across the resistor Ra' is equal to $$Vread'=Vdd-Ra'\cdot Iclamp, \quad (14)$$

and consequently related to the bit line voltage $V_{BL}$ by equation (7), any error being attributed to leakage diverted by deselected rows that may be minimized by decreasing bias from the selected column to the deselected rows.

The two N-channel MOSFETs N6, N7, connected together in current-mirror configuration, and the resistor Ra' act as a current/voltage converter, for providing the read voltage Vread' to the non-inverting terminal "+" of the differential amplifier 405.

The memory cells may be multi-level, i.e. storing more than one bit, such as four-level memory cells.

Accordingly, for discriminating the logic values stored, a plurality of suitable reference voltages may be provided for distinguishing more than two logic states. Furthermore, the arrangement of the plurality of memory cells can be an alignment or a multi-dimensional arrangement.

Figure 5:
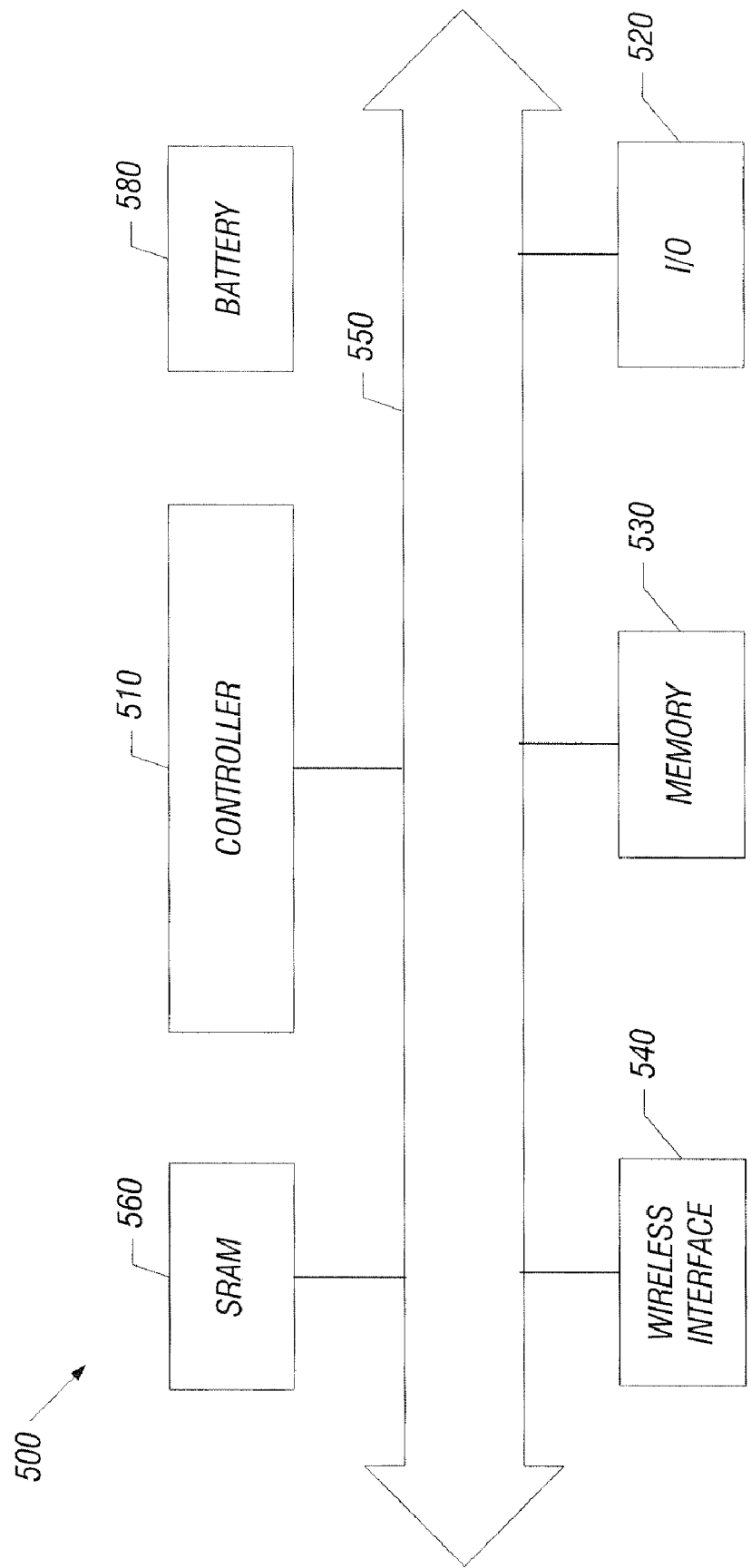
FIG. 5 is a system depiction of one embodiment of the present invention.

Turning to FIG. 5, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SPAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may be provided by one or more different types of memory. For example, memory 530 may comprise a volatile memory (any type of random access memory), a non-volatile memory such as a flash memory, and/or memory device 100 illustrated in FIG. 1 using embodiments described herein.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

Although the present invention has been disclosed and described by way of some embodiments, it is apparent to those skilled in the art that several modifications to the described embodiments, as well as other embodiments of the present invention are possible without departing from the scope thereof as defined in the appended claims.

What is claimed is:

1. A memory comprising:
an input circuit branch traversed by a clamping current;
an output circuit branch in current-mirror configuration with the input circuit branch to mirror the clamping current into the output circuit branch, the output circuit branch including a resistive element;
a phase change memory element;
a sense amplifier, coupled to said memory element, said sense amplifier including a clamping circuit having said input and output circuit branch to divert read current away from said memory element; and
wherein the sense amplifier further comprises a current to voltage converter to receive the clamping current to generate, by conversion of the clamping current, a measuring voltage corresponding to the resistance in the memory element.

2. The memory of claim 1, said sense amplifier to use said diverted read current to determine the state of said memory element.

3. The memory according to claim 1 including:
a first circuit branch traversed by a sense current; and
a second circuit branch in current-mirror configuration with the first circuit branch to mirror the sense current into the second circuit branch, the second circuit branch having anode to receive a clamping voltage to generate a control signal based on the sense current and the clamping voltage.

4. The memory according to claim 1, wherein the current to voltage converter includes the resistive element traversed by a current corresponding to the clamping current.

5. The memory according to claim 1, including a plurality of sense amplifiers, each sense amplifier being couplable to a respective memory cell, including at least one current sinker control circuit coupled to a respective group of sense amplifiers at least one sense amplifier.

6. The memory according to claim 1, including an access element coupled to said memory element, said access element including an amorphous material switchable from a non-thresholded condition to a thresholded condition, the access element in the non-thresholded condition decoupling the memory element from the sense amplifier and in the thresholded condition coupling the memory element to the sense amplifier.

* * * * *